(12) United States Patent
Winkler et al.

(10) Patent No.: US 8,088,304 B2
(45) Date of Patent: Jan. 3, 2012

(54) LUMINOPHORES MADE OF DOPED GARNET FOR PCLEDS

(75) Inventors: Holger Winkler, Darmstadt (DE); Tim Vosgroene, Ober-Ramstadt (DE); Thomas Juestel, Witten (DE); Stephanie Moeller, Steinfurt (DE)

(73) Assignee: Merck Patent Gesellschaft mit beschrankter Haftung, Darmstadt (DE)

( * ) Notice: Subject to any disclaimer, the term of this patent is extended or adjusted under 35 U.S.C. 154(b) by 88 days.

(21) Appl. No.: 12/530,075

(22) PCT Filed: Feb. 13, 2008

(86) PCT No.: PCT/EP2008/001074
§ 371 (c)(1),
(2), (4) Date: Sep. 4, 2009

(87) PCT Pub. No.: WO2008/107062
PCT Pub. Date: Sep. 12, 2008

(65) Prior Publication Data
US 2010/0084962 A1    Apr. 8, 2010

(30) Foreign Application Priority Data
Mar. 6, 2007   (DE) .................. 10 2007 010 719

(51) Int. Cl.
C09K 11/70 (2006.01)
C09K 11/77 (2006.01)
H01J 29/10 (2006.01)
(52) U.S. Cl. ................ 252/301.4 R; 313/467
(58) Field of Classification Search ........ 252/301.4 R, 252/301.4 F, 301.6 F; 313/467, 468; 427/58
See application file for complete search history.

(56) References Cited

U.S. PATENT DOCUMENTS

| | | | | |
|---|---|---|---|---|
| 6,552,487 B1 * | 4/2003 | Ellens et al. | ................... | 313/503 |
| 6,903,505 B2 * | 6/2005 | McNulty et al. | ............... | 313/504 |
| 7,015,640 B2 * | 3/2006 | Schaepkens et al. | ......... | 313/506 |
| 7,038,370 B2 * | 5/2006 | Mueller-Mach et al. | ..... | 313/485 |
| 7,045,956 B2 * | 5/2006 | Braune et al. | .................. | 313/512 |
| 7,083,490 B2 * | 8/2006 | Mueller et al. | .................. | 445/24 |
| 7,258,816 B2 * | 8/2007 | Tamaki et al. | .......... | 252/301.4 F |
| 7,541,005 B2 * | 6/2009 | Kulkarni et al. | ............... | 422/177 |
| 7,573,189 B2 * | 8/2009 | Juestel et al. | ................. | 313/503 |

(Continued)

FOREIGN PATENT DOCUMENTS

CN   101838536 A   *   9/2010

(Continued)

OTHER PUBLICATIONS

CN 101838536 A (translation of the abstract).*

(Continued)

*Primary Examiner* — Jerry Lorengo
*Assistant Examiner* — Lynne Edmondson
(74) *Attorney, Agent, or Firm* — Millen, White, Zelano & Branigan, P.C.

(57) ABSTRACT

The invention relates to phosphors having a garnet structure of the formula I $$(Y_a,Gd_b,Lu_c,Se_d,Sm_e,Tb_f,Pr_g,Th_h,Ir_i,Sb_j,Bi_k)_{3-x}(Al_l,Ga_m)_5O_{12}:Ce_x \quad (I)$$

where
$a+b+c+d+e+f+g+h+i+j+k=1$
$l+m=1$ and
$x=0.005$ to $0.1$,
and to a process for the preparation of these phosphors, and to the use thereof as conversion phosphors for conversion of the blue or near-UV emission from an LED.

25 Claims, 9 Drawing Sheets

U.S. PATENT DOCUMENTS

| | | | |
|---|---|---|---|
| 7,601,550 B2 * | 10/2009 | Bogner et al. | 438/27 |
| 7,671,529 B2 * | 3/2010 | Mueller et al. | 313/503 |
| 2003/0001495 A1 * | 1/2003 | Liu et al. | 313/512 |
| 2003/0011310 A1 * | 1/2003 | Juestel et al. | 313/640 |
| 2004/0067355 A1 * | 4/2004 | Yadav et al. | 428/323 |
| 2005/0164019 A1 * | 7/2005 | Liu et al. | 428/457 |
| 2005/0242329 A1 | 11/2005 | Fiedler et al. | |
| 2005/0244993 A1 * | 11/2005 | Bogner et al. | 438/22 |
| 2006/0022146 A1 | 2/2006 | Juestel et al. | |
| 2006/0226758 A1 * | 10/2006 | Sofue et al. | 313/483 |
| 2007/0252513 A1 | 11/2007 | Justel et al. | |

FOREIGN PATENT DOCUMENTS

| | | |
|---|---|---|
| DE | 102 02 741 A1 | 1/2003 |
| WO | WO 03/080764 A1 * | 10/2003 |
| WO | WO 03080764 A1 * | 10/2003 |
| WO | WO 2004/055910 A1 | 7/2004 |
| WO | WO 2005/061659 A1 | 7/2005 |
| WO | WO 2006/006099 A1 | 1/2006 |

OTHER PUBLICATIONS

International Search Report of PCT/EP2008/001074 (Jun. 2, 2008).

* cited by examiner

LUMINOPHORES MADE OF DOPED GARNET FOR PCLEDS

The invention relates to phosphors which consist of $Th^{4+}$-, $Sb^{3+}$-, $Ir^{3+}$- and/or $Bi^{3+}$-co-doped garnets, to the preparation thereof, and to the use thereof as LED conversion phosphor for white LEDs or so-called colour-on-demand applications.

The colour-on-demand concept is taken to mean the production of light of a certain colour point by means of a pcLED (=phosphor converted LED) using one or more phosphors. This concept is used, for example, in order to produce certain corporate designs, for example for illuminated company logos, trademarks, etc.

Conventional phosphors having a garnet structure, such as pure YAG:Ce or derivatives thereof, do not exhibit optimum spectroscopic properties on use, in particular, in high-power LEDs. The reasons for this are the following:
- the surface of the phosphor scatters a large proportion of the primary radiation, meaning that this proportion cannot be absorbed by the phosphor,
- the inhomogeneous distribution of the ions, in particular the activator ions, in the phosphor particles results in a reduction in the internal quantum yield,
- the small single-crystallite size of <300 nm results in surface effects playing a dominant role: on the one hand, the flaws present on the surface cause radiationless recombination in the crystal lattice, while on the other hand activator ions close to the surface are present in an inhomogeneous crystal field of the lattice and are not available for conversion effects or prevent the latter through energy migration to the surface, which are in turn associated with non-radiative recombination,
- a certain proportion of the fluorescent light produced in the phosphor cannot leave the phosphor since it is totally reflected at the interface to the optically thinner environment and migrates in the phosphor via wave conduction processes and is finally lost through re-absorption,
- a large proportion of the primary radiation entering the phosphor cannot be absorbed since the phosphor is saturated owing to its long lifetime (decay time $\tau_{1/e}$ YAG:Ce=63-67 ns, depending on the $Ce^{3+}$ concentration, see Weber M. J., Solid State commun. (1973) 12, 741) of the excited states.

EP-0142 931 discloses a visual display device in which a phosphor having a garnet structure is employed, and the substrate material essentially has the composition $Y_3Al_5O_{12}$.

EP-1095 998 discloses a phosphor of the composition $A_3B_5O_{12}$:(Ce, Pr), where A is a rare-earth metal from the group Y, Tb, La and/or Lu, and B stands for Al and/or Ga.

WO 2005/061659 describes a phosphor having a garnet structure of the $A_3B_5O_{12}$(Ce, Pr, Eu) type, where A=rare-earth metal and B=Al, Ga, where some of component B has been replaced by Si.

The phosphors currently used for white pcLEDs which contain a blue-emitting chip as primary radiation are principally YAG:$Ce^{3+}$ or derivatives thereof, or also orthosilicates $(Ca,Sr,Ba)_2SiO_4$ which are doped with $Eu^{2+}$. The phosphors are prepared by solid-state diffusion methods (also known as "mixing and firing" or "mix & fire") by mixing oxidic starting materials as powders, grinding the mixture and then calcining the mixture in an oven at temperatures up to 1700° C. for up to several days in an optionally reducing atmosphere. This gives phosphor powders which have inhomogeneities in relation to the morphology, the particle-size distribution and the distribution of the luminescent activator ions in the volume of the matrix. Furthermore, the morphology, particle-size distributions and further properties of these phosphors prepared by the traditional process can only be adjusted poorly and are difficult to reproduce. These particles therefore have a number of disadvantages, such as, in particular, inhomogeneous coating of the LED chips with these phosphors having a non-optimal and inhomogeneous morphology and particle-size distribution, which result in high loss processes due to scattering. Further losses arise in the production of these LEDs through the fact that the phosphor coating of the LED chips is not only inhomogeneous, but is also not reproducible from LED to LED. This results in variations of the colour points of the emitted light from the pcLEDs even within a batch. This makes a complex sorting process of the LEDs (so-called binning) necessary.

The object of the present invention is therefore to provide conversion phosphors for white LEDs or for colour-on-demand applications which do not have one or more of the above-mentioned disadvantages and produce warm-white light.

Surprisingly, the present object can be achieved by circumventing the above-mentioned disadvantages in that a conversion phosphor consists of $Th^{3+}$-, $Sb^{3+}$- and/or $Bi^{3+}$-co-doped garnets which are activated with cerium, where the preferred dopants are present at least in a concentration of 100 ppm.

A further surprising effect consists in that the phosphors according to the invention have higher luminous intensity than the non-co-doped YAG:Ce phosphors prepared by solid-state diffusion methods (cf. FIGS. 1 and 2).

The present invention thus relates to phosphors having a garnet structure of the formula I

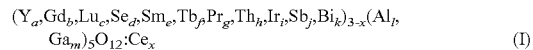

$$(Y_a,Gd_b,Lu_c,Se_d,Sm_e,Tb_f,Pr_g,Th_h,Ir_i,Sb_j,Bi_k)_{3-x}(Al_l,Ga_m)_5O_{12}:Ce_x \quad (I)$$

where
a+b+c+d+e+f+g+h+i+j+k=1
l+m=1 and
x=0.005 to 0.1.

Garnet structure here naturally also means a structure based on flaws or lattice defects which differs slightly from the ideal case of garnet, so long as this crystal retains the typical garnet structure. The typical garnet structure is generally taken to mean $A_3B_5O_{12}$:D, where A=rare-earth metal (RE); B=Al, Ga; and D=activator which replaces RE, such as, for example, cerium.

It is preferred for the doping concentration of the cerium to be between 0.5 and 10% by weight. It is particularly preferably between 2.0 and 5.0% by weight and most preferably between 3.0 and 3.5% by weight. At a cerium concentration between 3.0 and 3.5%, increased absorption and thus an increased light yield or greater brightness of the phosphor generally occurs. A higher cerium concentration would reduce the quantum yield and thus in turn result in a reduced light yield.

The absorption and emission spectrum, the thermal quenching behaviour and the decay time $\tau_{1/e}$ of luminescent materials of the formula I are highly dependent on the precise composition of the trivalent cations. A crucial factor for the spectroscopic properties mentioned above is the crystal field strength of the dodecahedron position on the $Ce^{3+}$ or the covalent character of the Ce—O bonds, i.e. the effective negative charge of the oxygen anions and the overlap of the anion and metal orbitals.

In general, it can be observed that the $Ce^{3+}$ emission band ([Xe]5$d^1$→[Xe]4$f^1$ transition) is shifted into the red spectral region with increasing crystal field strength or with increasing covalent character. Compositions of the above formula I or doping with electron-rich ("readily oxidisable") trivalent cations thus result in the spectral properties being influenced in this direction.

Particular preference is given to a phosphor of the formula I, where the compound of the formula I is a compound selected from the compounds of the formulae II to IV:

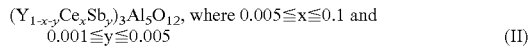

$(Y_{1-x-y}Ce_xSb_y)_3Al_5O_{12}$, where $0.005 \leq x \leq 0.1$ and $0.001 \leq y \leq 0.005$ (II)

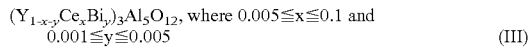

$(Y_{1-x-y}Ce_xBi_y)_3Al_5O_{12}$, where $0.005 \leq x \leq 0.1$ and $0.001 \leq y \leq 0.005$ (III)

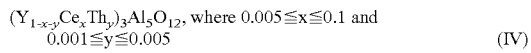

$(Y_{1-x-y}Ce_xTh_y)_3Al_5O_{12}$, where $0.005 \leq x \leq 0.1$ and $0.001 \leq y \leq 0.005$ (IV)

An increasing in proportion of one or more of the constituents Bi, Sb or Th in the garnet structure shifts the emission wavelength of the phosphor according to the invention towards red. This is particularly important for the production of warm-white light. For the production of comfortable light having high colour reproduction, it is advantageous to employ a mixture of different phosphors, namely a green-shifted phosphor, such as, for example, $Y_3(Al,Ga)_5O_{12}$, and the phosphor according to the invention, and a red phosphor (for example a red band or line emitter which can contribute a high lumen equivalent, such as europium-doped tungstates, molybdates and/or phosphates). Furthermore, it is also possible to admix blue-green phosphors, such as, for example, $Lu_3Al_5O_{12}$:Ce (LUAG:Ce). This gives rise to an approximately continuous emission spectrum which is very similar to the VIS daylight spectrum of the sun.

The particle size of the phosphors according to the invention is between 50 nm and 30 μm, preferably between 1 μm and 20 μm.

In a further embodiment, the phosphor of the formula I may additionally comprise at least one further of the following phosphor materials: oxides, molybdates, tungstates, vanadates, group III nitrides, (oxy)nitrides, each individually or mixtures thereof with one or more activator ions, such as Ce, Eu, Mn, Cr and/or Bi.

This is particularly advantageous if certain colour spaces are to be established.

In a further preferred embodiment, the phosphor has a structured (for example pyramidal) surface on the side opposite an LED chip (see DE 102006054330.0, Merck, which is incorporated into the context of the present application in its full scope by way of reference). This enables as much light as possible to be coupled out of the phosphor.

The structured surface on the phosphor is produced by subsequent coating with a suitable material which has already been structured, or in a subsequent step by (photo)lithographic processes, etching processes or by writing processes using energy or material beams or the action of mechanical forces.

In a further preferred embodiment, the phosphors according to the invention have, on the side opposite an LED chip, a rough surface which carries nanoparticles of $SiO_2$, $TiO_2$, $Al_2O_3$, $ZnO_2$, $ZrO_2$ and/or $Y_2O_3$ or combinations of these materials or of particles comprising the phosphor composition. A rough surface here has a roughness of up to a few 100 nm. The coated surface has the advantage that total reflection can be reduced or prevented and the light can be coupled out of the phosphor according to the invention better (see DE 102006054330.0 (Merck), which is incorporated into the context of the present application in its full scope by way of reference).

It is furthermore preferred for the phosphors according to the invention to have a refractive-index-adapted layer on the surface facing away from the chip, which simplifies the coupling-out of the primary radiation and/or the radiation emitted by the phosphor element.

In a further preferred embodiment, the phosphors have a continuous surface coating which consists of $SiO_2$, $TiO_2$, $Al_2O_3$, ZnO, $ZrO_2$ and/or $Y_2O_3$ or mixed oxides thereof. This surface coating has the advantage that adaptation of the refractive index to the environment can be achieved through a suitable graduation of the refractive indices of the coating materials. In this case, scattering of the light at the surface of the phosphor is reduced and a larger proportion of the light can penetrate into the phosphor and be absorbed and converted there. In addition, the refractive-index-adapted surface coating enables more light to be coupled out of the phosphor since total internal reflection is reduced.

In addition, a continuous layer is advantageous if the phosphor has to be encapsulated. This may be necessary in order to counter sensitivity of the phosphor or parts thereof to diffusing water or other materials in the direct vicinity. A further reason for encapsulation with a continuous sheath is thermal decoupling of the actual phosphor from the heat formed in the chip. This heat results in a reduction in the fluorescence light yield of the phosphor and can also affect the colour of the fluorescent light. Finally, a coating of this type enables the efficiency of the phosphor to be increased by preventing lattice vibrations forming in the phosphor from propagating into the environment.

In addition, it is preferred for the phosphors to have a porous surface coating which consists of $SiO_2$, $TiO_2$, $Al_2O_3$, ZnO, $ZrO_2$ and/or $Y_2O_3$ or mixed oxides thereof or of the phosphor composition. These porous coatings offer the possibility of further reducing the refractive index of a single layer. Porous coatings of this type can be produced by three conventional methods, as described in WO 03/027015, which is incorporated into the context of the present application in its full scope by way of reference: the etching of glass (for example soda-lime glasses (see U.S. Pat. No. 4,019,884)), the application of a porous layer, and the combination of a porous layer and an etching process.

In a further preferred embodiment, the phosphors have a surface which carries functional groups which facilitate chemical bonding to the environment, preferably consisting of epoxy or silicone resin. These functional groups may be esters or other derivatives which are bonded, for example, via oxo groups and are able to form links to constituents of the binders based on epoxides and/or silicones. Surfaces of this type have the advantage that homogeneous mixing of the phosphors into the binder is facilitated. Furthermore, the rheological properties of the phosphor/binder system and also the pot lives can consequently be adjusted to a certain extent. Processing of the mixtures is thus simplified.

Since the phosphor layer according to the invention applied to the LED chip preferably consists of a mixture of silicone and homogeneous phosphor particles and the silicone has a surface tension, this phosphor layer is non-uniform at a microscopic level, or the thickness of the layer is not constant throughout.

The present invention furthermore relates to a phosphor having a garnet structure obtainable by mixing aluminium-, yttrium- and cerium-containing starting materials with at least one antimony-, bismuth-, iridium- and/or thorium-containing co-dopant and optionally further gadolinium-, lutetium-, selenium-, samarium-, terbium-, praseodymium- and/or gallium-containing materials by wet-chemical methods and subsequent thermal aftertreatment.

The starting materials for the preparation of the phosphor consist, as mentioned above, of the base material (for example salt solutions of aluminium, yttrium and cerium) and at least one Sb-, Bi-, Ir- or Th-containing dopant and optionally further Gd-, Lu-, Sc-, Sm-, Tb-, Pr- and/or Ga-containing materials. Suitable starting materials are inorganic and/or organic substances, such as nitrates, carbonates, hydrogen-carbonates, phosphates, carboxylates, alcoholates, acetates, oxalates, halides, sulfates, organometallic compounds, hydroxides and/or oxides of the metals, semimetals, transition metals and/or rare earths, which are dissolved and/or suspended in inorganic and/or organic liquids. Preference is given to the use of mixed nitrate solutions, chloride or hydroxide solutions which contain the corresponding elements in the requisite stoichiometric ratio.

The present invention furthermore relates to a process for the preparation of a phosphor having the following process steps:

a) preparation of a cerium-activated phosphor which is co-doped with Sb-, Bi- and/or Th-containing materials from phosphor precursor suspensions or solutions by mixing at least three starting materials selected from Y-, Al-, Ce-, Gd-, Lu-, Sc-, Sm-, Tb-, Pr- and/or Ga-containing materials by wet-chemical methods, b) thermal aftertreatment of the Sb-, Bi- and/or Th-co-doped phosphor.

Wet-chemical preparation generally has the advantage over the conventional solid-state diffusion method that the resultant materials have greater uniformity with respect to the stoichiometric composition, the particle size and the morphology of the particles from which the phosphor according to the invention is prepared.

For wet-chemical pretreatment of an aqueous precursor of the phosphors (phosphor precursors) consisting, for example, of a mixture of yttrium nitrate, aluminium nitrate, cerium nitrate and bismuth nitrate solution, the following known methods are preferred:

coprecipitation with an $NH_4HCO_3$ solution (see, for example, Jander, *Blasius Lehrbuch der analyt. u. präp. anorg. Chem. [Textbook of Analyt. and Prep. Inorg. Chem.]* 2002)

Pecchini method using a solution of citric acid and ethylene glycol (see, for example, *Annual Review of Materials Research* Vol. 36: 2006, 281-331)

combustion method using urea spray-drying of aqueous or organic salt solutions (starting materials)

spray pyrolysis of aqueous or organic salt solutions (starting materials)

evaporation of nitrate solutions and thermal conversion of the residue

In the above-mentioned coprecipitation, an $NH_4HCO_3$ solution is added, for example, to nitrate solutions of the corresponding phosphor starting materials, resulting in the formation of the phosphor precursor.

In the Pecchini method, a precipitation reagent consisting of citric acid and ethylene glycol is added, for example, to the above-mentioned nitrate solutions of the corresponding phosphor starting materials at room temperature, and the mixture is subsequently heated. Increasing the viscosity results in phosphor precursor formation.

In the known combustion method, the above-mentioned nitrate solutions of the corresponding phosphor starting materials are, for example, dissolved in water, then boiled under reflux and treated with urea, resulting in the slow formation of the phosphor precursor.

Spray pyrolysis is one of the aerosol methods, which are characterised by spraying solutions, suspensions or dispersions into a reaction space (reactor) heated in various ways and the formation and deposition of solid particles. In contrast to spray-drying using hot-gas temperatures <200° C., thermal decomposition of the starting materials used (for example salts) and the re-formation of substances (for example oxides, mixed oxides) additionally occur, in addition to evaporation of the solvent, in spray pyrolysis as a high-temperature process.

The above-mentioned 6 method variants are described in detail in DE 102006027133.5 (Merck), which is incorporated into the context of the present application in its full scope by way of reference.

The phosphors according to the invention can be prepared by various wet-chemical methods by 1) homogeneously precipitating the constituents, then separating off the solvent, followed by a single- or multistep thermal aftertreatment, where one of these steps may be carried out in a reducing atmosphere, 2) finely dividing the mixture, for example with the aid of a spray process, and removing the solvent, followed by a single- or multistep thermal aftertreatment, where one of these steps may be carried out in a reducing atmosphere, or 3) finely dividing the mixture, for example with the aid of a spray process, and removing the solvent in association with pyrolysis, followed by a single- or multistep thermal aftertreatment, where one of these steps may be carried out in a reducing atmosphere, 4) subsequently coating the phosphors prepared with the aid of methods 1-3 in order to achieve refractive-index adaptation to their environment.

The wet-chemical preparation of the phosphor is preferably carried out by the precipitation and/or sol-gel method.

In the above-mentioned thermal aftertreatment, it is preferred for the calcination to be carried out at least partly under reducing conditions (for example using carbon monoxide, forming gas, pure hydrogen or at least a vacuum or oxygen-deficient atmosphere).

In general, it is also possible to prepare the phosphors according to the invention by the solid-state diffusion method, but this causes the disadvantages already mentioned.

The above-mentioned processes enable any desired outer shapes of the phosphor particles to be produced, such as spherical particles, flakes or structured materials and ceramics.

As a further preferred embodiment, flake-form phosphors are prepared by conventional processes from the corresponding metal and/or rare-earth salts. The preparation process is described in detail in EP 763573 and DE 102006054331.9, which are incorporated into the context of the present application in their full scope by way of reference. These flake-form phosphors can be prepared by coating a natural or synthetically produced, highly stable support or a substrate of, for example, mica flakes, $SiO_2$ flakes, $Al_2O_3$ flakes, $ZrO_2$ flakes, glass flakes or $TiO_2$ flakes which has a very large aspect ratio, an atomically smooth surface and an adjustable thickness with a phosphor layer by a precipitation reaction in aqueous dispersion or suspension. Besides mica, $ZrO_2$, $SiO_2$, $Al_2O_3$, glass or $TiO_2$ or mixtures thereof, the flakes may also consist of the phosphor material itself or be built up from a material. If the flake itself serves merely as support for the phosphor coating, the latter must consist of a material which is transparent to the primary radiation from the LED, or absorbs the primary radiation and transmits this energy to the phosphor layer. The flake-form phosphors are dispersed in a resin (for example silicone or epoxy resin), and this dispersion is applied to the LED chip.

The flake-form phosphors can be prepared on a large industrial scale in thicknesses of 50 nm to about 20 μm, preferably between 150 nm and 5 μm. The diameter here is from 50 nm to 20 μm.

It generally has an aspect ratio (ratio of the diameter to the particle thickness) from 1:1 to 400:1 and in particular 3:1 to 100:1.

The flake size (length×width) is dependent on the arrangement. Flakes are also suitable as centres of scattering within the conversion layer, in particular if they have particularly small dimensions.

The surface of the flake-form phosphor according to the invention facing the LED chip can be provided with a coating which has a reflection-reducing action in relation to the primary radiation emitted by the LED chip. This results in a reduction in back-scattering of the primary radiation, enhancing coupling of the latter into the phosphor element according to the invention. Suitable for this purpose are, for example, refractive-index-adapted coatings, which must have a following thickness d: d=[wavelength of the primary radiation from the LED chip/(4*refractive index of the phosphor ceramic)], see, for example, Gerthsen, Physik [Physics], Springer Verlag, 18th Edition, 1995. This coating may also consist of photonic crystals, which also encompasses structuring of the surface of the flake-form phosphor in order to achieve certain functionalities.

The preparation of the phosphors according to the invention in the form of ceramic elements is carried out analogously to the process described in DE 102006037730 (Merck), which is incorporated into the context of the present application in its full scope by way of reference. The phosphor here is prepared by mixing the corresponding starting materials and dopants by wet-chemical methods, subsequently pressing the mixture isostatically and applying the mixture directly to the surface of the chip in the form of a homogeneous, thin and non-porous flake. No location-dependent variation of the excitation and emission of the phosphor thus takes place, causing the LED provided therewith to emit a homogeneous light cone of constant colour and to have high luminous power. The ceramic phosphor elements can be produced on a large industrial scale, for example, as flakes in thicknesses from a few 100 nm to about 500 μm. The flake size (length×width) is dependent on the arrangement. In the case of direct application to the chip, the size of the flake should be selected in accordance with the chip size (from about 100 μm*100 μm to several mm$^2$) with a certain excess size of about 10%-30% of the chip surface in the case of a suitable chip arrangement (for example flip-chip arrangement) or correspondingly. If the phosphor flake is installed on top of a finished LED, all of the emitted light cone will hit the flake.

The side surfaces of the ceramic phosphor element can be metallised with a light or noble metal, preferably aluminium or silver. The metallisation has the effect that light does not exit laterally from the phosphor element. Light exiting laterally can reduce the light flux to be coupled out of the LED. The metallisation of the ceramic phosphor element is carried out in a process step after isostatic pressing to give rods or flakes, where, if desired, the rods or flakes can be cut to the necessary size before the metallisation. To this end, the side surfaces are wetted, for example with a solution of silver nitrate and glucose, and subsequently exposed to an ammonia atmosphere at elevated temperature. During this operation, a silver coating, for example, forms on the side surfaces.

Alternatively, electroless metallisation processes are suitable, see, for example, Hollemann-Wiberg, Lehrbuch der anorganischen Chemie [Textbook of Inorganic Chemistry], Walter de Gruyter Verlag, or Ullmanns Enzyklopädie der chemischen Technologie [Ullmann's Encyclopaedia of Chemical Technology].

The ceramic phosphor element can, if necessary, be fixed to the substrate of an LED chip using a water-glass solution.

In a further embodiment, the ceramic phosphor element has a structured (for example pyramidal) surface on the side opposite an LED chip. This enables as much light as possible to be coupled out of the phosphor element. The structured surface on the phosphor element is produced by carrying out the isostatic pressing using a mould having a structured press plate and thus embossing a structure into the surface. Structured surfaces are desired if the aim is to produce the thinnest possible phosphor elements or flakes. The pressing conditions are known to the person skilled in the art (see J. Kriegsmann, Technische keramische Werkstoffe [Industrial Ceramic Materials], Chapter 4, Deutscher Wirtschaftsdienst, 1998). It is important that the pressing temperatures used are ⅔ to ⅚ of the melting point of the substance to be pressed.

In addition, the phosphors according to the invention can be excited over a broad range, which extends from about 410 nm to 530 nm, preferably 430 nm to about 500 nm. These phosphors are thus not only suitable for excitation by UV or blue-emitting primary light sources, such as LEDs, or conventional discharge lamps (for example based on Hg), but also for light sources like those which utilise the blue In$^{3+}$ line at 451 nm.

The present invention furthermore relates to an illumination unit having at least one primary light source whose emission maximum or maxima is or are in the range 410 nm to 530 nm, preferably 430 nm to about 500 nm, particularly preferably 440 to 480 nm, where the primary radiation is partially or fully converted into longer-wavelength radiation by the phosphors according to the invention. This illumination unit preferably emits white light or emits light having a certain colour point (colour-on-demand principle). Preferred embodiments of the illumination units according to the invention are depicted in FIGS. 3 to 14.

In a preferred embodiment of the illumination unit according to the invention, the light source is a luminescent indium aluminium gallium nitride, in particular of the formula In$_i$Ga$_j$Al$_k$N, where $0 \leq i$, $0 \leq j$, $0 \leq k$, and $i+j+k=1$. Possible forms of light sources of this type are known to the person skilled in the art. They can be light-emitting LED chips having various structures.

In a further preferred embodiment of the illumination unit according to the invention, the light source is a luminescent arrangement based on ZnO, TCO (transparent conducting oxide), ZnSe or SiC or an arrangement based on an organic light-emitting layer (OLED).

In a further preferred embodiment of the illumination unit according to the invention, the light source is a source which exhibits electroluminescence and/or photoluminescence. The light source may furthermore also be a plasma or discharge source.

The phosphors according to the invention can either be dispersed in a resin (for example epoxy or silicone resin) or, given suitable size ratios, arranged directly on the primary light source or, depending on the application, arranged remote therefrom (the latter arrangement also includes "remote phosphor technology"). The advantages of remote phosphor technology are known to the person skilled in the art and are revealed, for example, in the following publication: Japanese Journ. of Appl. Phys. Vol. 44, No. 21 (2005). L649-L651.

In a further embodiment, it is preferred for the optical coupling of the illumination unit between the phosphor and the primary light source to be achieved by means of a light-conducting arrangement. This enables the primary light source to be installed at a central location and to be optically coupled to the phosphor by means of light-conducting devices, such as, for example, light-conducting fibres. In this way, lamps matched to the illumination wishes and merely consisting of one or different phosphors, which may be arranged to form a light screen, and a light conductor, which is coupled to the primary light source, can be achieved. In this way, it is possible to position a strong primary light source at a location which is favourable for the electrical installation and to install lamps comprising phosphors which are coupled to the light conductors at any desired locations without further electrical cabling, but instead only by laying light conductors.

The present invention furthermore relates to the use of the phosphors according to the invention for partial or complete conversion of the blue or near-UV emission from a luminescent diode.

The phosphors according to the invention are furthermore preferably used for conversion of the blue or near-UV emission into visible white radiation. The phosphors according to the invention are furthermore preferably used for conversion of the primary radiation into a certain colour point by the "colour-on-demand" concept.

The present invention furthermore relates to the use of the phosphors according to the invention in electroluminescent materials, such as, for example, electroluminescent films (also known as lighting films or light films), in which, for example, zinc sulfide or zinc sulfide doped with $Mn^{2+}$, $Cu^+$ or $Ag^+$ is employed as emitter, which emit in the yellow-green region. The areas of application of the electroluminescent film are, for example, advertising, display backlighting in liquid-crystal display screens (LC displays) and thin-film transistor (TFT) displays, self-illuminating vehicle licence plates, floor graphics (in combination with a crush-resistant and slip-proof laminate), in display and/or control elements, for example in automobiles, trains, ships and aircraft, or also domestic appliances, garden equipment, measuring instruments or sport and leisure equipment.

The following examples are intended to illustrate the present invention. However, they should in no way be regarded as limiting. All compounds or components which can be used in the compositions are either known and commercially available or can be synthesised by known methods. The temperatures indicated in the examples are always given in ° C. It furthermore goes without saying that, both in the description and also in the examples, the added amounts of the components in the compositions always add up to a total of 100%. Percentage data given should always be regarded in the given connection. However, they usually always relate to the weight of the part-amount or total amount indicated.

EXAMPLES

Example 1

Preparation of the Phosphor $(Y_{0.939}Ce_{0.06}Th_{0.001})_3Al_5O_{12}$ by a Wet-Chemical Method 537.6 g of ammonium hydrogencarbonate are dissolved in 3 liters of deionised water. 205.216 g of aluminium chloride hexahydrate, 151.522 g of yttrium chloride hexahydrate, 3.617 g of cerium chloride hexahydrate and 0.191 g of thorium(IV) chloride are dissolved in about 400 ml of deionised water and rapidly added dropwise to the hydrogencarbonate solution. During this addition, the pH must be kept at pH 8 by addition of conc. ammonia. The mixture is subsequently stirred for a further hour. After ageing, the precipitate is filtered off and dried at about 120° C. in a drying cabinet.

The dried precipitate is ground in a mortar and subsequently calcined at 1000° C. in air for 4 hours. The product is subsequently re-ground in a mortar and calcined at 1700° C. in a hydrogen/argon atmosphere for 8 hours.

Example 2

Preparation of the Phosphor $(Y_{0.939}Ce_{0.06}Bi_{0.001})_3Al_5O_{12}$ by a Wet-Chemical Method 537.6 g of ammonium hydrogencarbonate are dissolved in 3 liters of deionised water. 205.216 g of aluminium chloride hexahydrate, 151.522 g of yttrium chloride hexahydrate, 3.617 g of cerium chloride hexahydrate and 0.161 g of bismuth(III) chloride are dissolved in about 400 ml of deionised water and rapidly added dropwise to the hydrogencarbonate solution. During this addition, the pH must be kept at pH 8 by addition of conc. ammonia. The mixture is subsequently stirred for a further hour. After ageing, the precipitate is filtered off and dried at about 120° C. in a drying cabinet.

The dried precipitate is ground in a mortar and subsequently calcined at 1000° C. in air for 4 hours. The product is subsequently re-ground in a mortar and calcined at 1700° C. in a hydrogen/argon atmosphere for 8 hours.

Example 3

Preparation of the Phosphor $(Y_{0.939}Ce_{0.06}Sb_{0.001})_3Al_5O_{12}$ by a Wet-Chemical Method 537.6 g of ammonium hydrogencarbonate are dissolved in 3 liters of deionised water. 205.216 g of aluminium chloride hexahydrate, 151.522 g of yttrium chloride hexahydrate, 3.617 g of cerium chloride hexahydrate and 0.116 g of antimony(III) chloride are dissolved in about 400 ml of deionised water and rapidly added dropwise to the hydrogencarbonate solution. During this addition, the pH must be kept at pH 8 by addition of conc. ammonia. The mixture is subsequently stirred for a further hour. After ageing, the precipitate is filtered off and dried at about 120° C. in a drying cabinet.

The dried precipitate is ground in a mortar and subsequently calcined at 1000° C. in air for 4 hours. The product is subsequently re-ground in a mortar and calcined at 1700° C. in a hydrogen/argon atmosphere for 8 hours.

Example 4

Preparation of YAG:Ce (with Ce Doping Concentration 2%, $Y_{2.94}Al_5O_{12}:Ce_{0.06}^{3+}$) by the Mixing & Firing Method (Solid-State Diffusion)

0.344 g of cerium dioxide ($CeO_2$), 33.646 g of yttrium oxide ($Y_2O_3$) and 25.491 g of aluminium oxide ($Al_2O_3$) are weighed out and slurried with water. This mixture is wet-ground by using a small amount of water in the mortar. The slurry is then transferred into a chamber furnace, where it is calcined in a forming-gas atmosphere at a temperature of 1200° C. over a period of 6 h. After cooling, the material is again finely ground and subjected to reductive calcination in the furnace at a temperature of 1700° C. over a period of 8 hours.

Example 5

Preparation of YAG:Ce (with Ce Doping Concentration 2%, $Y_{2.94}Al_5O_{12}:Ce_{0.06}^{3+}$) by the Wet-Chemical Method 537.6 g of ammonium hydrogencarbonate are dissolved in 3 liters of deionised water. 205.216 g of aluminium chloride hexahydrate, 153.242 g of yttrium chloride hexahydrate and 3.617 g of cerium chloride hexahydrate are dissolved in about 400 ml of deionised water and rapidly added dropwise to the hydrogencarbonate solution. During this addition, the pH must be kept at pH 8 by addition of conc. ammonia. The mixture is subsequently stirred for a further hour. After ageing, the precipitate is filtered off and dried at about 120° C. in a drying cabinet.

The dried precipitate is ground in a mortar and subsequently calcined at 1000° C. in air for 4 hours. The product is subsequently re-ground in a mortar and calcined at 1700° C. in a hydrogen/argon atmosphere for 8 hours.

Examples 6 to 8

Preparation of the Phosphors $(Y_{0.98-x}Ce_{0.02}Th_x)_3Al_5O_{12}$ Where x=0.001; x=0.0025 and x=0.005 by the Mixing & Firing Method (Solid-State Diffusion)

12.5 mmol of gamma-aluminium oxide $Al_2O_3$, 7.35 mmol−x of yttrium oxide $Y_2O_3$, 0.3 mmol of cerium dioxide $CeO_2$ and 0.015 mmol≦x≦0.075 mmol of thorium oxide $ThO_2$ are weighed out. The starting materials are subsequently slurried with acetone and ground thoroughly in a mortar. In the first calcination step, the samples are heated at 1200° C. under carbon monoxide for two hours. After further thorough grinding in a mortar, the second calcination step is carried out, in which the batch is heated at 1650° C., likewise under a carbon monoxide atmosphere, for four hours. After final grinding in a mortar, the samples are characterised by X-ray powder diffractometry, luminescence spectroscopy and reflection spectroscopy.

DESCRIPTION OF THE FIGURES

The invention will be explained in greater detail below with reference to a number of working examples, in which.

Commercial YAG:Ce, prepared by solid-state diffusion reaction:
(x/y)=0.435/0.541
YAG:Ce prepared by wet-chemical methods:
(x/y)=0.435/0.541

Figure 2A:
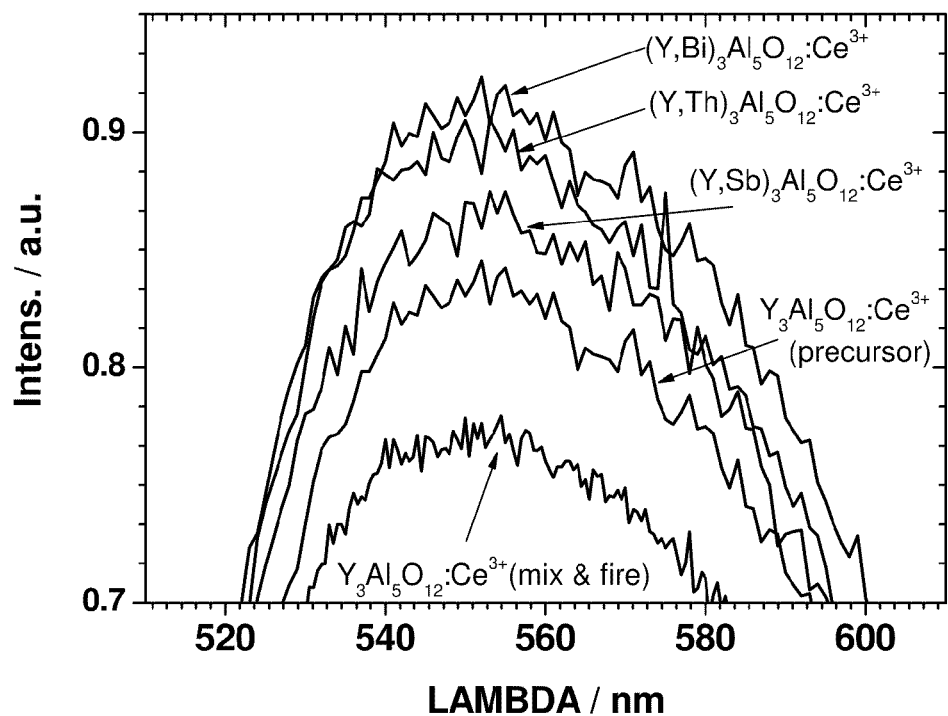
FIG. 2a: Enlarged view of the emission spectra for better illustration of the different emission maxima. The phosphors according to the invention prepared by wet-chemical methods and doped with Bi, Th or Sb surprisingly have a higher fluorescence intensity than the commercial pure YAG:Ce prepared by solid-state diffusion reactions and the pure YAG:Ce prepared by wet-chemical methods.
Colour points in the (x,y) CIE 1937 chromaticity diagram: $(Y_{0.969}Ce_{0.02}X_{0.001})_3Al_5O_{12}$,
where X=Sb: (x/y)=0.438/0.541,
where X=Bi: (x/y)=0.440/0.539,
where X=Th: (x/y)=0.439/0.541
Figure 2B:
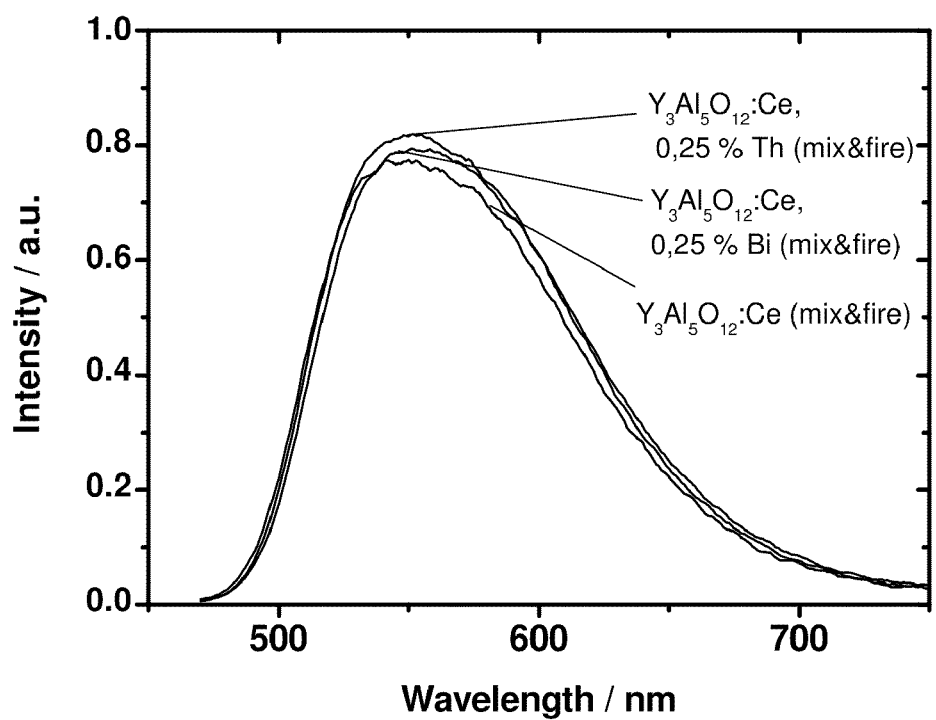

FIG. 2b: Emission spectra of the phosphors according to the invention $(Y,Bi)_3Al_5O_{12}:Ce$ and $(Y,Th)_3Al_5O_{12}:Ce$, which have been prepared by solid-state diffusion reaction (mix & fire) compared with non-co-doped YAG:Ce.

Figure 3:
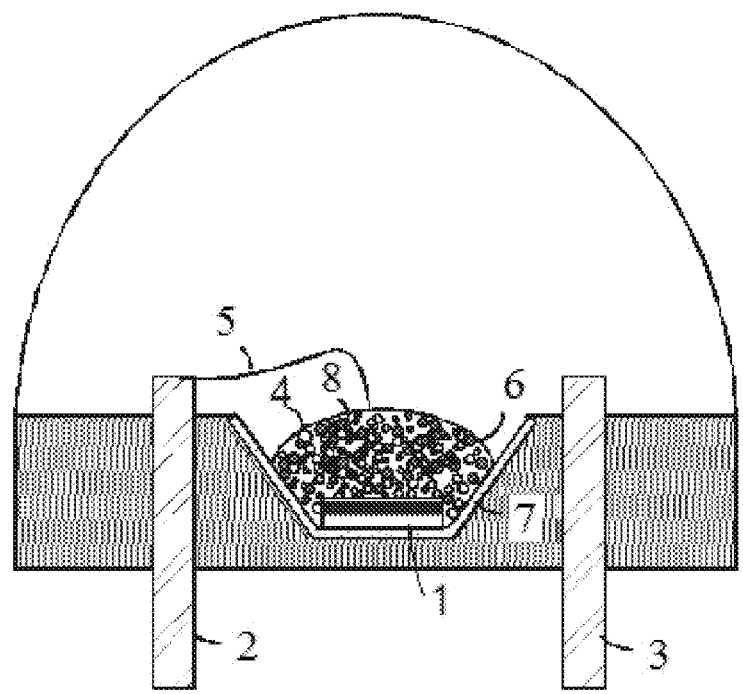

FIG. 3: shows the diagrammatic depiction of a light-emitting diode with a phosphor-containing coating. The component comprises a chip-like light-emitting diode (LED) as radiation source. The light-emitting diode is installed in a cup-shaped reflector, which is held by an adjustment frame. The chip is connected via a flat cable to a first contact and directly to a second electrical contact. A coating comprising a conversion phosphor according to the invention has been applied to the inside curvature of the reflector cup. The phosphors are either employed separately from one another or as a mixture. (List of part numbers: 1 chip, 2,3 electrical connections, 4 conversion phosphor, 5 flat cable, 6 resin, 7 reflector, 8 diffuser).

Figure 4:
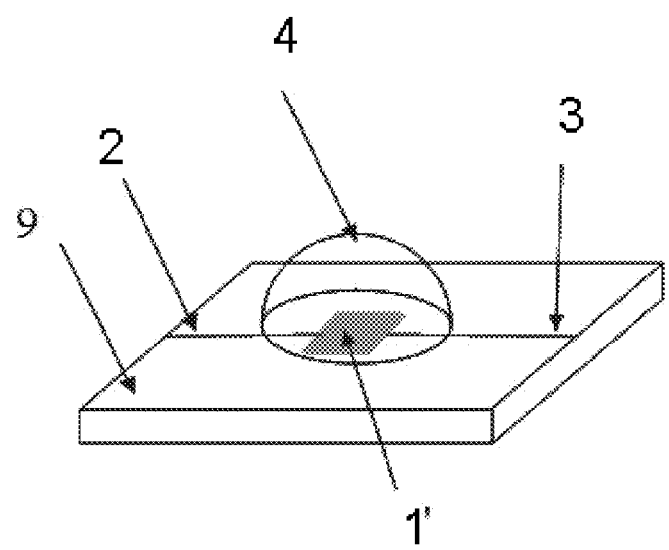

FIG. 4: shows a COB (chip on board) package of the InGaN type, which serves as light source (LED) for white light (1'=semiconductor chip; 2,3=electrical connections; 4=conversion phosphor; 9=board). The phosphor is distributed in a binder lens, which simultaneously represents a secondary optical element and influences the light emission characteristics as a lens.

Figure 5:
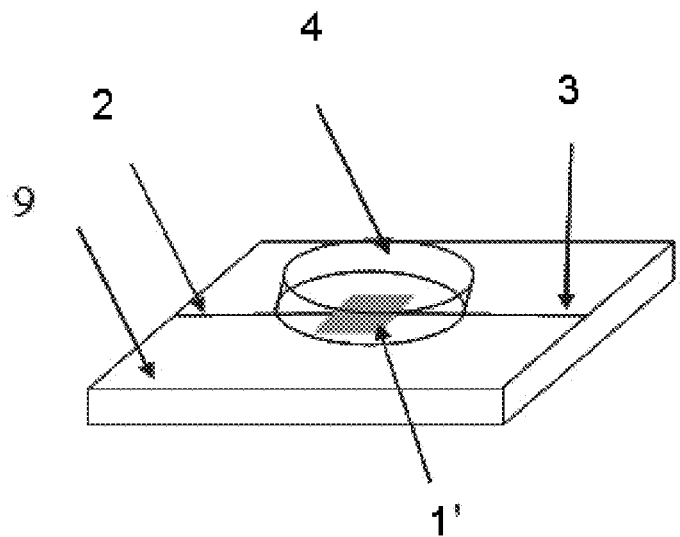

FIG. 5: shows a COB (chip on board) package of the InGaN type, which serves as light source (LED) for white light (1'=semiconductor chip; 2,3=electrical connections; 4=conversion phosphor; 9=board). The phosphor is located, distributed in a thin binder layer, directly on the LED chip. A secondary optical element consisting of a transparent material can be placed thereon.

Figure 6:
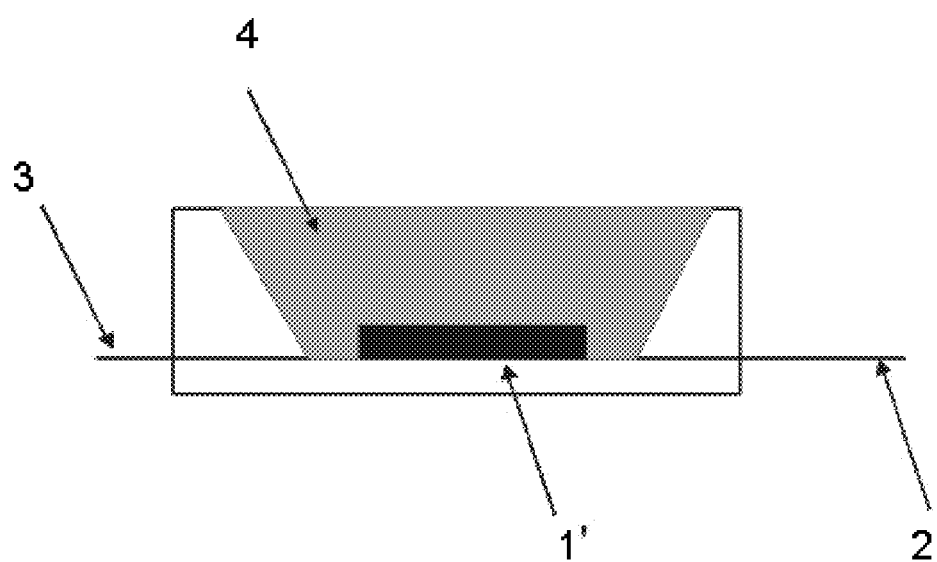

FIG. 6: shows a GOLDEN DRAGON® package, which serves as light source (LED) for white light (1'=semiconductor chip; 2,3=electrical connections; 4=conversion phosphor in cavity with reflector). The conversion phosphor is dispersed in a binder, where the mixture fills the cavity.

Figure 7:
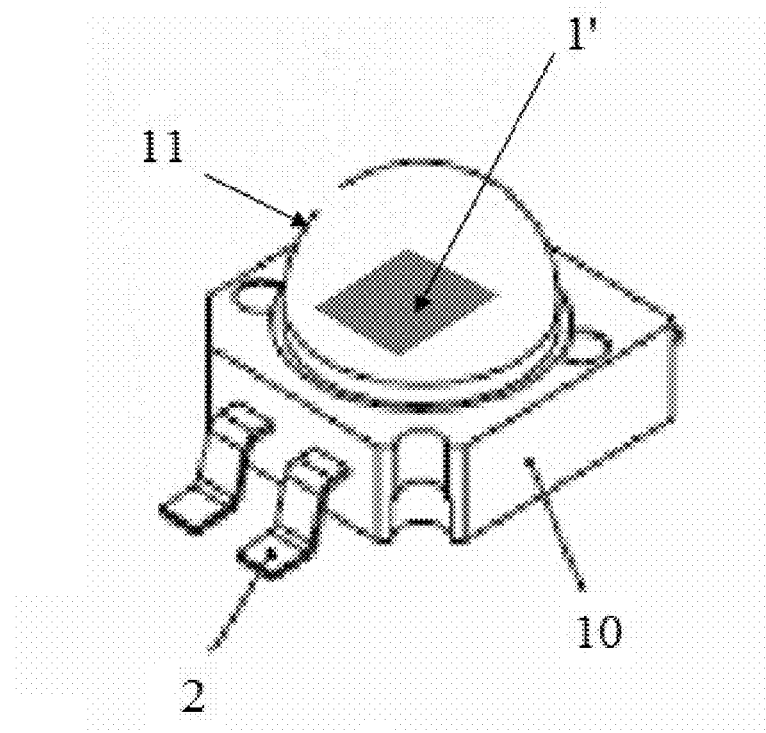

FIG. 7: shows a LUXEON® package, where 10=housing; 2=electrical connection; 11=lens; 1'=semiconductor chip. This design has the advantage of being a flip-chip design, in which a larger proportion of the light from the chip can be used for lighting purposes via the transparent substrate and a reflector on the base. In addition, heat dissipation is favoured in this design.

Figure 8:
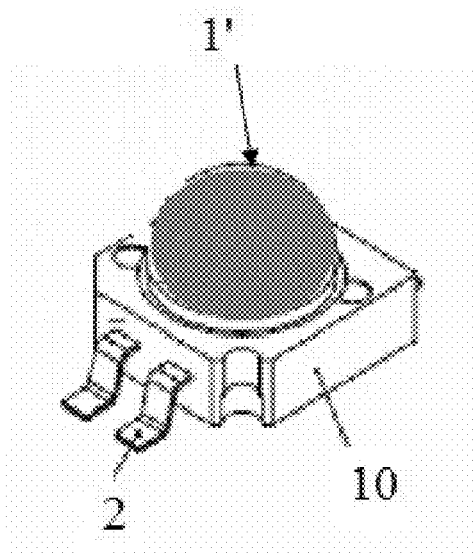

FIG. 8: shows a package, where 10=housing; 2=electrical connection; 1'=semiconductor chip, and the cavity beneath the lens is completely filled with the conversion phosphor according to the invention. This package has the advantage that a larger amount of conversion phosphor can be used. It can also act as remote phosphor.

Figure 9:
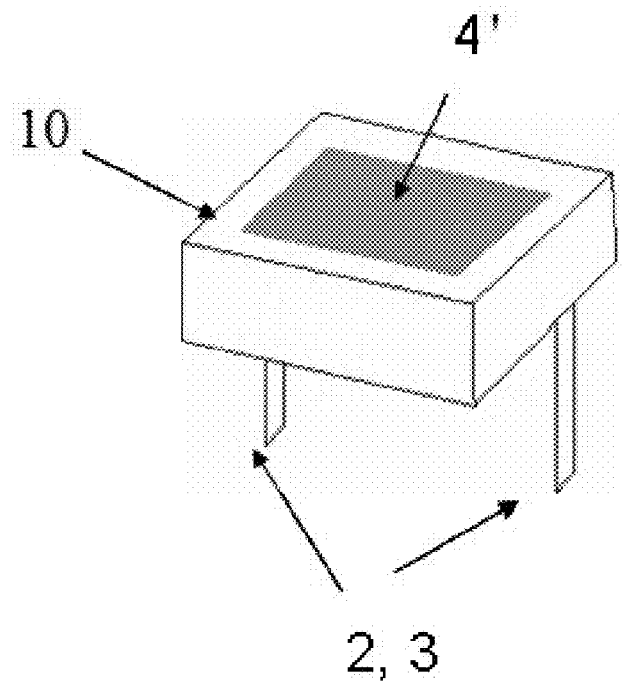

FIG. 9: shows an SMD package (surface mounted package), where 10=housing; 2, 3=electrical connections; 4'=conversion layer. The semiconductor chip is completely covered with the phosphor according to the invention. The SMD design has the advantage that it has a small physical size and thus fits into conventional lamps.

Figure 10:
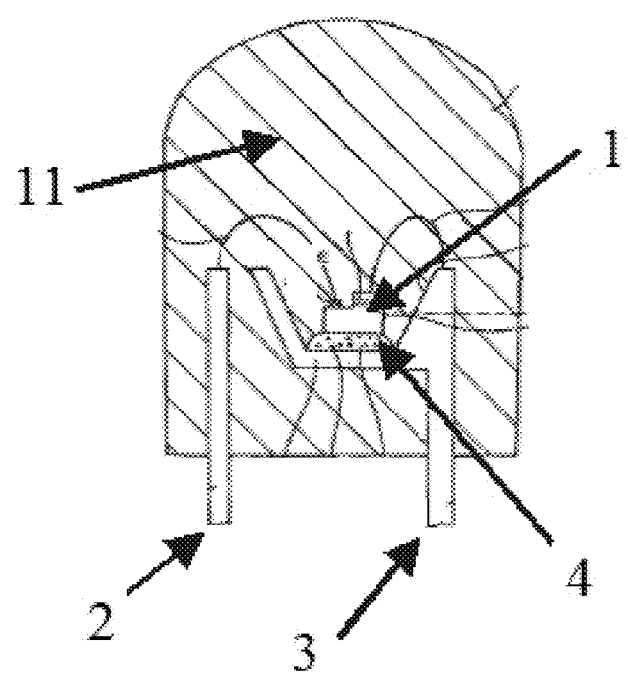

FIG. 10: shows a T5 package, where] 4=conversion phosphor; 1=chip; 2, 3=electrical connections; 11=lens with transparent resin. The conversion phosphor is located on the back of the LED chip, which has the advantage that the phosphor is cooled via the metallic connections.

Figure 11:
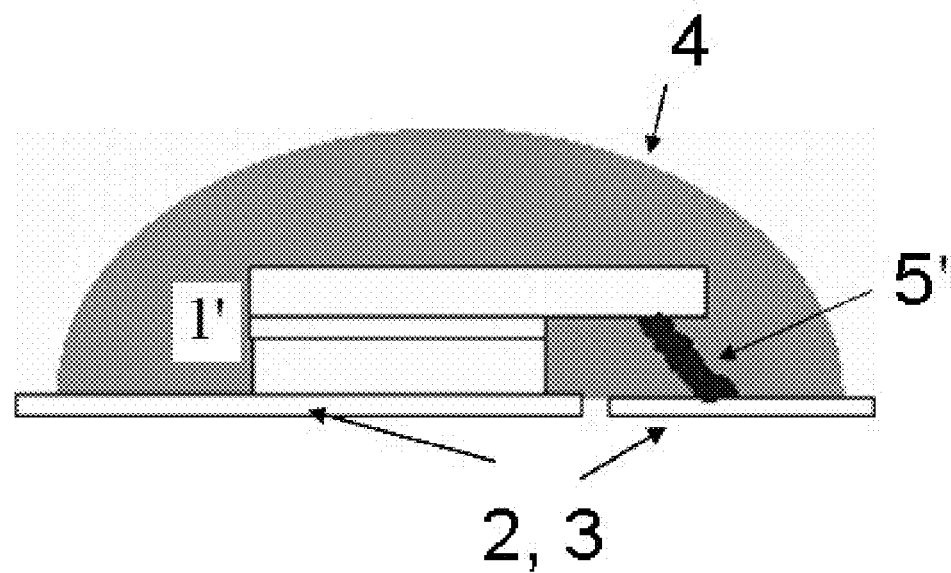

FIG. 11: shows a diagrammatic depiction of a light-emitting diode, where 1'=semiconductor chip; 2,3=electrical connections; 4=conversion phosphor; 5'=bond wire, where the phosphor is applied as top globe in a binder. This form of the phosphor/binder layer can act as secondary optical element and influence, for example, light propagation.

Figure 12:
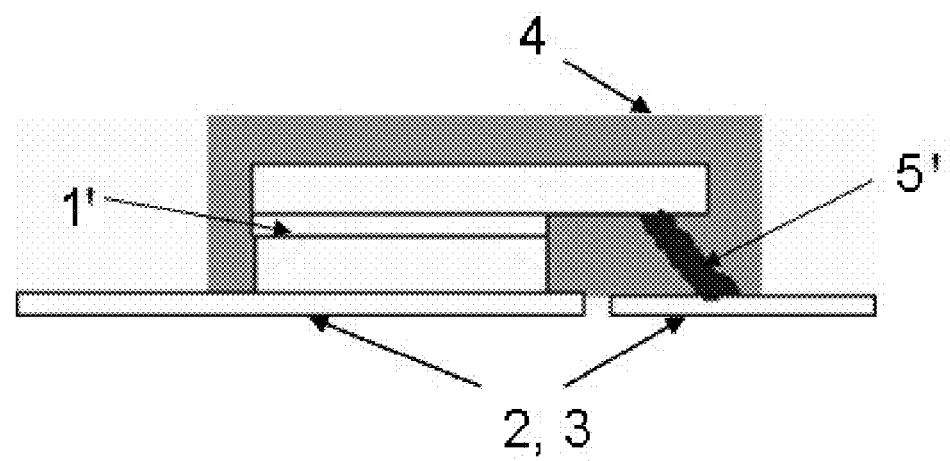

FIG. 12: shows a diagrammatic depiction of a light-emitting diode, where 1'=semiconductor chip; 2,3=electrical connections; 4=conversion phosphor; 5'=bond wire, where the phosphor is applied dispersed as a thin layer in a binder. A further component acting as secondary optical element, such as, for example, a lens, can easily be applied to this layer.

Figure 13:
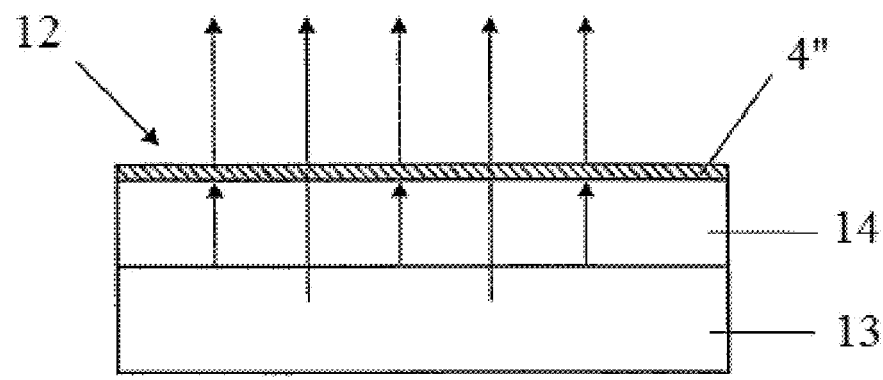

FIG. 13: shows an example of a further application, as is already known in principle from U.S. Pat. No. 6,700,322. The phosphor according to the invention is used here together with an OLED. The light source is an organic light-emitting diode 12, consisting of the actual organic film 13 and a transparent substrate 14. The film 13 emits, in particular, blue primary light, produced, for example, by means of PVK:PBD:coumarin (PVK, abbreviation for poly(N-vinylcarbazole); PBD, abbreviation for 2-(4-biphenyl)-5-(4-tert-butylphenyl)-1,3,4-oxadiazole). The emission is partially converted into yellow, secondarily emitted light by a cover layer formed by a layer 4'' of the phosphor according to the invention, so that overall white emission is achieved by colour mixing of the primarily and secondarily emitted light. The OLED essentially consists of at least one layer of a light-emitting polymer or of so-called small molecules between two electrodes, which consist of materials known per se, such as, for example, ITO (abbreviation for indium tin oxide), as anode and a highly reactive metal, such as, for example, Ba or Ca, as cathode. Often, a plurality of layers are also used between the electrodes, which either serve as hole-transport layer or, in the area of small molecules, also serve as electron-transport layers. The emitting polymers used are, for example, polyfluorenes or polyspiro materials.

Figure 14:
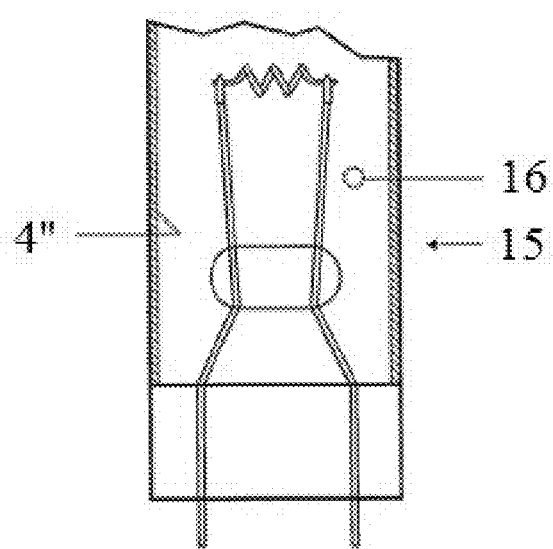

FIG. 14: shows a low-pressure lamp 15 with a mercury-free gas filling 16 (diagrammatic), which contains an indium filling and a buffer gas analogously to WO 2005/061659, where a layer 4'' of the phosphors according to the invention is applied.

REFERENCE CHARACTER LIST

1=chip
1'=semiconductor chip
2, 3=electrical connections
4=conversion phosphor
4'=conversion layer
4''=layer of phosphor
5=flat cable
5'=bond wire
6=resin
7=reflector
8=diffuser
9=board
10=housing
11=lens
12=organic light emitting diode
13=organic film
14=transparent substrate
15=low pressure lamp
16=mercury-free gas filling

BRIEF DESCRIPTION OF THE DRAWINGS

Figure 1:
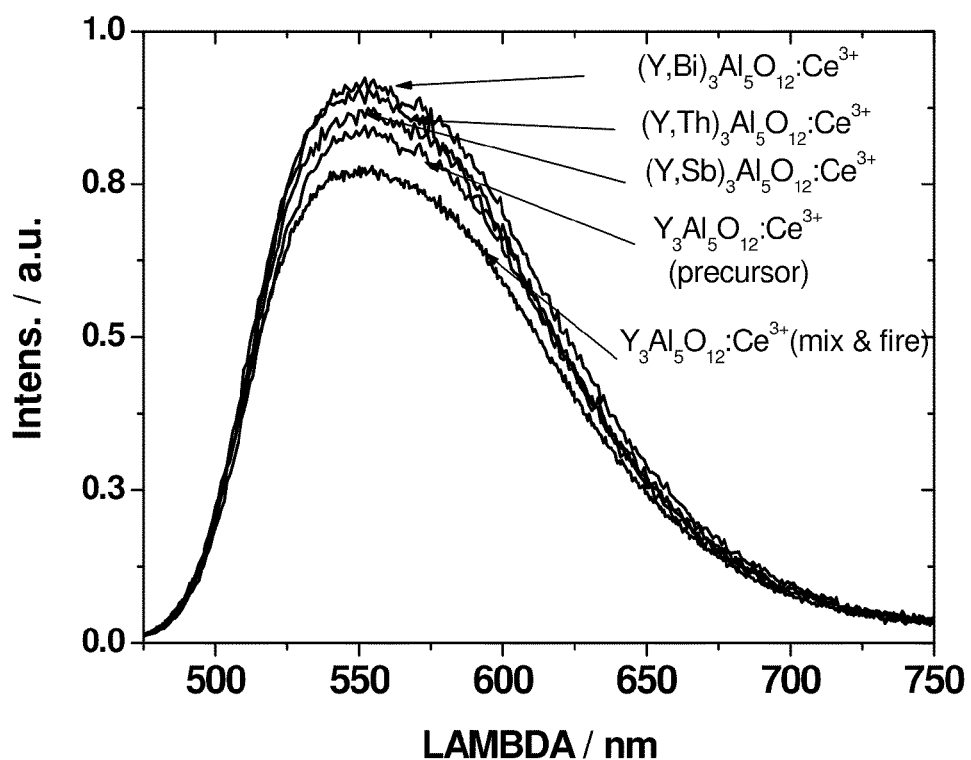
FIG. 1: Emission spectra of the phosphors according to the invention $(Y,Bi)_3Al_5O_{12}:Ce$, $(Y,Th)_3Al_5O_{12}:Ce$ and $(Y,Sb)_3Al_5O_{12}:Ce$ compared with a commercially available pure $Y_3Al_5O_{12}:Ce$ containing 2% of Ce prepared by solid-state diffusion reaction (mix & fire) and a pure YAG:Ce (precursor) prepared by wet-chemical methods. The excitation wavelength is 450 nm (x axis: LAMBDA/nm=wavelength in nm; y axis: Intens./nm=fluorescence intensity in arbitrary units).

FIG. 1: illustrates emission spectra,
FIG. 2a: illustrates emission spectra,
FIG. 2b: illustrates emission spectra,
FIG. 3: illustrates a light-emitting diode,
FIG. 4: illustrates a chip on board package,
FIG. 5: illustrates a chip on board package,
FIG. 6: illustrates a GOLDEN DRAGON® package
FIG. 7: illustrates a LUXEON®package,
FIG. 8: illustrates a package where the cavity beneath the lens is completely filled with the conversion phosphor,
FIG. 9: illustrates a surface mounted package,
FIG. 10: illustrates a T5 package,
FIG. 11: illustrates a light-emitting diode,
FIG. 12: illustrates a light-emitting diode,
FIG. 13: illustrates an organic light-emitting diode, and
FIG. 14: illustrates a low-pressure lamp.

The invention claimed is:

1. A phosphor having a garnet structure, which is one of the formulae II to IV:

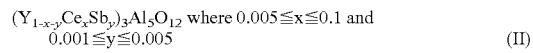

$(Y_{1-x-y}Ce_xSb_y)_3Al_5O_{12}$ where $0.005 \leq x \leq 0.1$ and $0.001 \leq y \leq 0.005$ (II)

$(Y_{1-x-y}Ce_xBi_y)_3Al_5O_{12}$ where $0.005 \leq x \leq 0.1$ and $0.001 \leq y \leq 0.005$ (III)

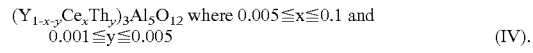

$(Y_{1-x-y}Ce_xTh_y)_3Al_5O_{12}$ where $0.005 \leq x \leq 0.1$ and $0.001 \leq y \leq 0.005$ (IV).

2. A phosphor according to claim 1, which has a rough surface which carries nanoparticles of $SiO_2$, $TiO_2$, $Al_2O_3$, ZnO, $ZrO_2$ and/or $Y_2O_3$ or mixed oxides thereof or particles comprising the phosphor composition.

3. A phosphor according to claim 1, which has a continuous surface coating which consists of $SiO_2$, $TiO_2$, $Al_2O_3$, ZnO, $ZrO_2$ and/or $Y_2O_3$ or mixed oxides thereof.

4. A phosphor according to claim 1, which has a porous surface coating which consists of $SiO_2$, $TiO_2$, $Al_2O_3$, ZnO, $ZrO_2$ and/or $Y_2O_3$ or mixed oxides thereof or of the phosphor composition.

5. A phosphor according to claim 1, which has a surface that carries functional groups which facilitate chemical bonding to the environment, which are optionally of epoxy or silicone resin.

6. A phosphor according to claim 1, which is obtainable by mixing aluminium-, yttrium- and cerium-containing starting materials with one of Sb-, Bi-, or Th-containing co-dopant by a wet-chemical method and subsequent thermal aftertreatment.

7. A process for preparing a phosphor according to claim 1, comprising
  a) preparation of a cerium-activated phosphor which is co-doped with antimony-, bismuth-, or thorium-containing materials from phosphor precursor suspensions or solutions by mixing at least three starting materials Y-, Al-, Ce-containing materials by a wet-chemical method,
  b) thermal aftertreatment of the phosphor co-doped with antimony, bismuth, or thorium.

8. A process according to claim 7, wherein the phosphor precursor is prepared in step a) by a wet-chemical method from organic and/or inorganic metal and/or rare-earth salts by a sol-gel method, precipitation method and/or drying method, and/or spray drying.

9. A process according to claim 7, wherein the surface of the phosphor is coated with nanoparticles of $SiO_2$, $TiO_2$, $Al_2O_3$, ZnO, $ZrO_2$ and/or $Y_2O_3$ or mixed oxides thereof or with nanoparticles of the phosphor composition.

10. A process according to claim 7, wherein the surface of the phosphor is provided with a continuous coating of $SiO_2$, $TiO_2$, $Al_2O_3$, ZnO, $ZrO_2$ and/or $Y_2O_3$ or mixed oxides thereof.

11. A process according to claim 7, wherein the surface of the phosphor is provided with a porous coating of $SiO_2$, $TiO_2$, $Al_2O_3$, ZnO, $ZrO_2$ and/or $Y_2O_3$ or mixed oxides thereof or of the phosphor composition.

12. An illumination unit having at least one primary light source whose emission maximum is in the range 410 nm to 530 nm, which is partially or fully converted into longer-wavelength radiation by a phosphor according to claim 1.

13. An illumination unit according to claim 12, wherein the light source is a luminescent indium aluminium gallium nitride, optionally of the formula $In_iGa_jAl_kN$, where $0 \leq i$, $0 \leq j$, $0 \leq k$, and $i+j+k=1$.

14. An illumination unit according to claim 12, wherein the light source is a luminescent compound based on ZnO, TCO (transparent conducting oxide), ZnSe or SiC.

15. An illumination unit according to claim 12, wherein the light source is a material based on an organic light-emitting layer.

16. An illumination unit according to claim 12, wherein the light source is a source which exhibits electroluminescence and/or photoluminescence.

17. An illumination unit according to claim 12, wherein the light source is a plasma or discharge source.

18. An illumination unit according to claim 12, wherein the phosphor is arranged directly on the primary light source and/or remote therefrom.

19. An illumination unit according to claim 12, wherein the optical coupling between the phosphor and the primary light source is achieved by a light-conducting arrangement.

20. A method of converting blue or near-UV emission from a luminescent diode, comprising converting by a phosphor according to claim 1.

21. A method of converting primary radiation into a certain colour point by the colour-on-demand concept, comprising converting by a phosphor according to claim 1.

22. A method of converting blue or near-UV emission into visible white radiation, comprising converting by a phosphor according to claim 1.

23. A phosphor according to claim 1, which is of the formula II $$(Y_{1-x-y}Ce_xSb_y)_3Al_5O_{12} \text{ where } 0.005 \leq x \leq 0.1 \text{ and } 0.001 \leq y \leq 0.005 \quad \text{(II)}.$$

24. A phosphor according to claim 1, which is of the formula III $$(Y_{1-x-y}Ce_xBi_y)_3Al_5O_{12} \text{ where } 0.005 \leq x \leq 0.1 \text{ and } 0.001 \leq y \leq 0.005 \quad \text{(III)}.$$

25. A phosphor according to claim 1, which is of the formula IV $$(Y_{1-x-y}Ce_xTh_y)_3Al_5O_{12} \text{ where } 0.005 \leq x \leq 0.1 \text{ and } 0.001 \leq y \leq 0.005 \quad \text{(IV)}.$$

* * * * *